(12) United States Patent
Miyashita et al.

(10) Patent No.: US 6,543,107 B1
(45) Date of Patent: *Apr. 8, 2003

(54) METHOD OF PRODUCING A PIEZOELECTRIC THIN FILM

(75) Inventors: Satoru Miyashita, Suwa (JP); Masakazu Shinozuka, Suwa (JP); Tetsushi Takahashi, Suwa (JP)

(73) Assignee: Seiko Epson Corporation, Tokyo-TO (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 71 days.

(21) Appl. No.: 08/807,724

(22) Filed: Feb. 28, 1997

Related U.S. Application Data (62) Division of application No. 08/603,816, filed on Feb. 20, 1996, now abandoned.

(30) Foreign Application Priority Data

Feb. 20, 1995 (JP) .................................. 7-31035
Dec. 12, 1995 (JP) ................................ 7-322662

(51) Int. Cl.[7] .......................... H04R 17/00; B05D 5/12
(52) U.S. Cl. ...................... 29/25.35; 427/100; 427/379; 427/380; 156/89.11; 156/89.12; 264/614; 264/620; 264/621; 310/358; 310/800
(58) Field of Search ................................ 310/328, 358, 310/800; 29/25.35, 830, 890.1, 527.1, 527.2; 427/100, 379, 380, 418; 156/89.11, 89.12, 89.16; 264/614, 620, 621

(56) References Cited

U.S. PATENT DOCUMENTS

| | | | | |
|---|---|---|---|---|
| 4,820,586 A | * | 4/1989 | Krueger et al. | 427/100 |
| 5,116,643 A | * | 5/1992 | Miller et al. | 427/100 |
| 5,271,956 A | * | 12/1993 | Paz-Pujalt | 427/100 |
| 5,391,393 A | * | 2/1995 | Maniar | 427/100 |
| 5,453,294 A | * | 9/1995 | Ogi et al. | 427/100 |
| 5,500,988 A | * | 3/1996 | Moynihan et al. | 427/100 |
| 5,683,614 A | * | 11/1997 | Boyle | 427/100 |
| 5,873,154 A | * | 2/1999 | Ylilammi et al. | 29/25.35 |

OTHER PUBLICATIONS

Barrow et al, "Thick Ceramic Coatings using a sol gel based ceramic–ceramic 0–3 composite", Surface & Coatings Technology, pp. 113–118, Nov. 1995.*

Yi et al, "Preparation of Pb(ZrTi)O2 thin films by sol gel processing: Electrical, optical and electro–optic properties", Journal of Applied Physics, pp. 2717–2724, Sep. 1985.*

* cited by examiner

Primary Examiner—A. Dexter Tugbang
(74) Attorney, Agent, or Firm—Ladas & Parry (57) ABSTRACT

A method for producing the piezoelectric thin film is based on a sol-gel process and comprises the steps of: coating a substrate with a sol composition comprising a sol, of a metal component for constituting a piezoelectric film, and a polymer compound and then drying the coating to form a film; pre-sintering the film to form a porous thin film of gel comprising an amorphous metal oxide; pre-annealing the porous thin film of gel to convert the film to a film of a crystalline metal oxide; repeating the steps at least once to form laminated films of a crystalline metal oxide; and annealing the films thus prepared to grow crystal grains of perovskite type in the film into a larger size.

10 Claims, 3 Drawing Sheets

METHOD OF PRODUCING A PIEZOELECTRIC THIN FILM

This is a divisional of application Ser. No. 08/603,816 filed on Feb. 20, 1996, now abandoned.

BACKGROUND OF THE INVENTION

1. Field of the Invention

The present invention relates to a piezoelectric thin film usable as an actuator in ink jet recording apparatuses and the like.

2. Background Art

Piezoelectric and ferroelectric thin films represented by lead zirconate titanate ("PZT") thin films can be prepared by sputtering, sol-gel processing, CVD, laser ablation or other processes. In particular, according to the sol-gel process, the composition of the PZT film can be easily controlled. Further, the sol-gel process has an additional advantage that a thin film can be successfully formed by repeating the step of coating a sol composition and the step of pre-sintering the coating. In addition, patterning by photoetching can be carried out during the preparation of a piezoelectric devise by the sol-gel process so that the PZT film is easily formed into a piezoelectric device. An ink jet recording head using a piezoelectric thin film prepared by the sol-gel process has also been proposed (Japanese Patent Laid-Open No. 504740/1993). A film thickness of about 0.5 to 20 $\mu$m is in general necessary for a piezoelectric device for an ink jet recording head. Further, in the piezoelectric device for the ink jet recording head, the piezoelectric strain constant is high. The growth of crystal grains by annealing at a temperature of 700° C. or above may be necessary to preferably provide such a high piezoelectric strain constant.

However, an attempt to prepare a piezoelectric thin film having a certain film thickness, for example, a film thickness of not less than 1 $\mu$m, by the sol-gel process has often cracks in the film during annealing step for the formation of a perovskite structure.

Further, a method in which comprises the steps of coating a sol composition, heating the coating at a high temperature to cause crystallization, and repeating the steps to increase the film thickness has been proposed (e.g., Philips J. Res. 47 (1993) 263–285). So far as the present inventors know, however, the piezoelectric thin film prepared by this method has an interface created by the lamination, i.e., a multilayer structure. The presence of the interface adversely affects piezoelectric properties and often makes it impossible to realize good patterning by etching in the preparation of a piezoelectric device with the thin film.

Therefore, a need still exists for a piezoelectric thin film having good properties and a method for producing the same has been desired in the art.

SUMMARY OF THE INVENTION

Accordingly, an object of the present invention is to provide a piezoelectric thin film having good properties, for example, a high dielectric constant and a high piezoelectric strain constant, and a method for producing the same.

Another object of the present invention is to provide a piezoelectric thin film, which does not suffer from cracks at the time of annealing and has no interface created by the lamination, and a method for producing the same.

The present inventors have now found that a piezoelectric thin film having good properties can be provided by modifying the sol-gel process. The present invention has been made based on such finding.

The piezoelectric thin film according to the present invention comprises a thin film with the average grain area of crystal grains observed on the surface of the thin film being not less than 0.1 $\mu$m$^2$, the thin film having no multilayer structure in its cross section.

The method for producing a piezoelectric thin film according to a first aspect of the present invention is based on a sol-gel process and comprises the steps of:

a) coating a substrate with a sol composition comprising a sol, of a metal component for constituting a piezoelectric film, and a polymer compound and then drying the coating to form a film;

b) pre-sintering the film to form a porous thin film of gel comprising an amorphous metal oxide;

c) pre-annealing the porous thin film of gel to convert the film to a film of a crystalline metal oxide;

d) repeating the steps a), b), and c) at least once to form laminated films of a crystalline metal oxide; and e) annealing the films prepared in the step d) to grow crystal grains of perovskite type in the film into a larger size.

The method for producing a piezoelectric thin film according to a second aspect of the present invention is based on a sol-gel process and comprises the steps of:

a) coating a substrate with a sol composition comprising a sol, of a metal component for constituting a piezoelectric film, and a polymer compound and then drying the coating to form a film;

b) pre-sintering the film to form a porous thin film of gel comprising an amorphous metal oxide;

f) repeating the steps a) and b) at least once to form laminated layers of porous thin films comprising an amorphous metal oxide;

c') pre-annealing the laminated layers to convert the layer to a film of a crystalline metal oxide;

d') repeating the steps f) and c') at least once to form laminated films of a crystalline metal oxide; and e') annealing the films prepared in the step d') to grow crystal grains of perovskite type in the film into a larger size.

DETAILED DESCRIPTION OF THE INVENTION

Piezoelectric Thin Film

In the piezoelectric thin film according to the present invention, the average grain area of crystal grains observed on the surface of the thin film is not less than 0.1 $\mu$m$^2$, and the thin film has no multilayer structure in its cross section. According to a preferred embodiment of the present invention, the average grain area of crystal grains observed on the surface of the film is preferably 0.1 to 50 $\mu$m$^2$. Further, in the present invention, the crystal structure is preferably composed mainly of a perovskite structure. Such a piezoelectric thin film has good properties. Specifically, it has a specific dielectric constant of preferably about 1,000 to 3,000, more preferably about 1,200 to 2,500, and a piezoelectric strain constant of preferably about 60 to 200 pC/N, more preferably 90 to 180 pC/N.

According to a preferred embodiment of the present invention, the average grain area of crystal grains observed on the surface of the thin film is 0.5 to 50 $\mu m^2$, and the thickness of the thin film is 0.5 to 20 $\mu m$.

It is preferable that the thin film piezoelectric device according to the present invention comprises a so-called two-component system in which lead zirconate titanate (PZT) is the main component. Specific examples of the composition of a two-component system include those represented by the following formula:

$$Pb(Zr_xTi_{1-x})O_3 + YPbO$$

wherein X and Y are $0.40 \leq X \leq 0.6$ and $0 \leq Y \leq 0.3$, respectively.

Further, the composition of the thin film piezoelectric device according to the present invention comprises a three-component system in which a third component, for example, lead niobate magnesium, is added to the PZT. Specific examples of the composition of a three-component system include those represented by the following formula:

$$PbTi_aZr_b(A_gB_h)_cO_3 + ePbO + (fMgO)_n$$

wherein

A represents a divalent metal selected from the group consisting of Mg, Co, Zn, Cd, Mn and Ni, or a trivalent metal selected from the group consisting of Sb, Y, Fe, Sc, Yb, Lu, In and Cr;

B represents a quinquevalent metal selected from the group consisting of Nb, Ta and Sb, or a sexivalent metal selected from the group consisting of W and Te; and a to h fulfill the following conditions:

$$a+b+c=1,$$

$$0.35 \leq a \leq 0.55,$$

$$0.25 \leq b \leq 0.55,$$

$$0.1 \leq c \leq 0.4,$$

$$0 \leq e \leq 0.3,$$

$$0 \leq f \leq 0.15c,$$

$$g=h=\frac{1}{2},$$

and $$n=o,$$

provided that when A represents the trivalent metal, B does not represent sexivalent metal, and when A represents the divalent metal and B represents the quinquevalent metal, g is $\frac{1}{3}$ and h is $\frac{2}{3}$, and only when A is Mg and B is Nb, n is 1.

A more preferable specific example of the composition of a three-component system is one in which A represents Mg, B represents Nb, g is $\frac{1}{3}$ and h is $\frac{2}{3}$.

In the compositions, it is preferable that PbO be in the above ranges in order to make the crystal grains of the piezoelectric film large and dense. Further, when A is Mg and B is Nb, the presence of MgO prevents PbO from evaporating in the course of thermal treatment, and the reaction between PbO and a silicon substrate is also prevented. Furthermore, MgO stabilizes the perovskite structure which improves the piezoelectric properties.

In order to improve the piezoelectric properties, an extremely small amount of Ba, Sr, La, Nd, Nb, Ta, Sb, Bi, W, Mo, or Ca may also be incorporated into the piezoelectric film of either a two-component system or a three-component system. In particular, in the case of the three-component system, it is preferable to incorporate 0.10 mol % or less of Sr or Ba in order to improve the piezoelectric properties. Further, in the case of the three-component system, it is also preferable to incorporate 0.10 mol % or less of Mn or Ni in order to enhance the degree of sintering of the piezoelectric film.

The composition of the piezoelectric thin film according to the present invention may be regulated by regulating the ratio of metals in a gel composition used in the method which will be described later.

Method for Producing Piezoelectric Thin Film

The piezoelectric thin film according to the present invention can be preferably produced by the following two methods.

Method According to First Aspect of Invention

Step a)

The method for producing a piezoelectric film according to the present invention is based on the sol-gel process. Specifically, the method basically comprises dehydrating a hydrated complex of a hydroxide of metal components capable of forming a piezoelectric film, that is, a sol, to give a gel and heating and sintering the gel to prepare an inorganic oxide, that is, a piezoelectric film.

In the present invention, the sol of metal components for constituting the piezoelectric film can be prepared by hydrolyzing an alkoxide or acetate of metals, capable of forming a piezoelectric film, with, for example, an acid. In the present invention, the above composition of the piezoelectric thin film can be provided by regulating the sol composition in terms of metals. An alkoxide or acetate of each of titanium, zirconium, lead and other metal components is used as a starting material. The method according to the present invention has an advantage that the ratio of metal components, for constituting the piezoelectric thin film, in the sol composition is substantially maintained until the piezoelectric thin film is finally provided. This means that a variation in the ratio of metal components attributable to the evaporation of metal components, especially lead component, during sintering and annealing hardly occurs. Therefore, the ratio of metal components in the starting material is identical to the ratio of metals in the final piezoelectric thin film. In other words, the composition of the sol is determined according to the composition of the piezoelectric film to be produced.

In the present invention, the sol composition preferably contains an organic polymer compound. The organic polymer compound absorbs the residual stress of the thin film at the time of drying and sintering, enabling the creation of a crack in the thin film to be effectively prevented. More specifically, the use of a sol containing the organic polymer results in creation of pores in the gelled thin film described below. The pores are considered to absorb the residual stress of the thin film in the step of pre-annealing and annealing described below. Preferred organic polymer compounds used herein include polyvinyl acetate, hydroxypropyl cellulose, polyethylene glycol, polyethylene glycol monomethyl ether, polyvinyl alcohol, polyacylic acid, polyamide, polyamic acid, acetylcellulose and its derivatives, and copolymer thereof. According to a preferred embodiment of the present invention, the addition of polyvinyl acetate enables the formation of a porous thin film of gel, with a large number of pores having a size of about 0.05 μm, and the addition of hydroxypropyl cellulose enables the formation of a porous thin film of gel, having a size of not more than 1 μm and a broad size distribution.

In the method according to the present invention, a substrate is to be formed is first coated with the sol composition. The term "substrate" used herein is intended to mean a substrate which finally constitutes a part of a finally formed thin film piezoelectric device. Therefore, for example, when an ink jet recording head utilizing the piezoelectric thin film according to the present invention, which will be described later, is prepared, a crystalline silicon having thereon a thin-film electrode is used as the substrate.

The coating method is not particularly limited and may be any conventional method commonly used in the art, for example, spin coating, dip coating, roll coating, and bar coating. Further, it is possible to coat the composition with flexographic printing, screen printing and offset printing.

According to a preferred embodiment of the present invention, when the following steps are taken into consideration, the thickness of the coating formed by the above method is regulated so that the thickness of the porous thin film of gel formed in the step b) described below is preferably not less than 0.01 μm, more preferably about 0.1 to 1 μm.

The resultant coating is then dried. The drying may be carried out by air drying or by heating at a temperature of 200° C. or below.

According to the preferred embodiment of the present invention, a further coating may be formed on the dried coating to increase the thickness of the coating. In this embodiment, the coating on which the further coating is formed may be preferably dried at a temperature of 80° C. or more.

Step b)

In this step, the film, of the sol composition, formed in the step a) is gelled. Specifically, the film in the step a) is sintered to prepare a porous thin film of gel containing an amorphous metal oxide which is substantially free from organic compounds. This step is often referred herein to as the "step of pre-sintering."

The pre-sintering temperature and time may be such that the film of the sol composition is gelled. According to a preferred embodiment of the present invention, the pre-sintering temperature is preferably in the range of from 300 to 450° C., more preferably in the range of from 350 to 400° C. The pre-sintering time may vary depending upon the type of the oven used. For example, when a degreasing oven is used, the pre-sintering time is preferably about 10 to 120 minutes, more preferably about 15 to 60 minutes. On the other hand, when a hot plate is used, the pre-sintering time is preferably about 1 to 60 minutes, more preferably about 5 to 30 minutes.

Figure 1:
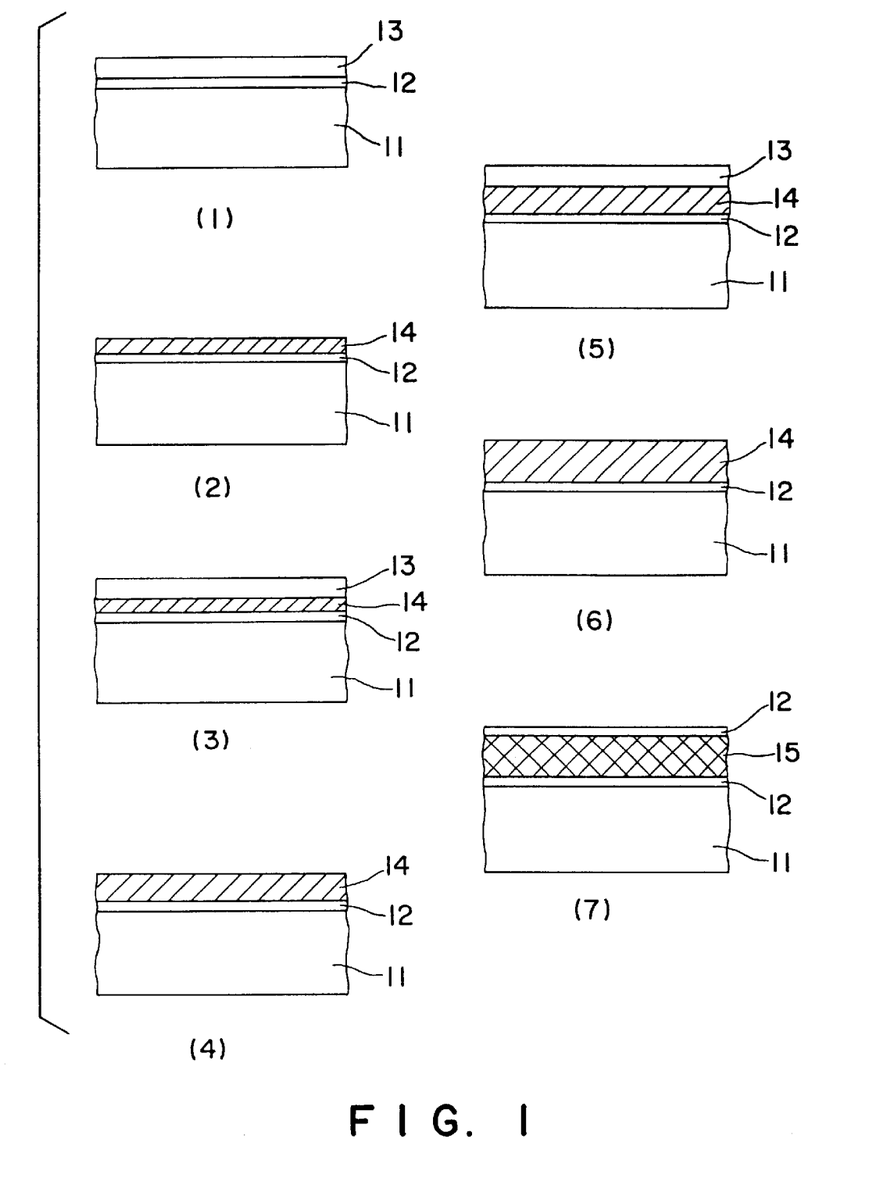
FIG. 1 is a diagram schematically showing the method for producing a thin film piezoelectric device according to a first aspect of the present invention.

As shown in FIG. 1 (1), the steps a) and b) result in the formation of a porous thin film 13, of gel, on an electrode 12 provided on a substrate 11.

Step c)

In this step, the porous thin film, of gel, formed in the step b) is heated and sintered, thereby converting the thin film to a film of a crystalline metal oxide. This step is often referred herein as the "step of pre-annealing."

The sintering may be carried out by heating the porous thin film of gel at a temperature high enough to convert the thin film of gel to a film of a crystalline metal oxide. In this case, the porous thin film of gel need not be sintered to such an extent that the perovskite crystal occupies the major part of the crystals. The sintering may be terminated at the time when the thin film of gel has been uniformly crystallized. According to a preferred embodiment of the present invention, the sintering temperature is preferably in the range of from 400 to 800° C., more preferably in the range of from 550 to 750° C. The sintering time may vary depending upon the sintering temperature and the type of the oven used. For example, when an annealing oven is used, the sintering time is preferably about 0.1 to 5 hr, more preferably about 0.5 to 2 hr. On the other hand, when RTA oven is used, the sintering time is preferably about 0.1 to 10 minutes, more preferably about 1 to 5 minutes.

Further, according to a preferred embodiment of the present invention, the pre-annealing may be carried out in two stages. Preferably, the first stage is carried out at a temperature in the range of from 400 to 600° C., and the second stage is carried out at a temperature in the range of from 600 to 800° C. According to a more preferred embodiment of the present invention, the first stage is carried out at a temperature in the range of from 450 to 550° C., and the second stage is carried out at a temperature in the range of from 600 to 750° C.

As shown in FIG. 1 (2), in the step c), the porous thin film 13 of gel is converted to a film 14 formed of a crystalline metal oxide.

Step d)

In the present invention, the steps a), b), and c) are repeated at least once to laminate a film(s) formed of a crystalline metal oxide. The film thickness, pre-sintering temperature, and pre-annealing conditions may be as described above for the formation of the first film on the substrate.

The thickness of the laminated films in this step may be determined by taking the film thickness of the final piezoelectric thin film into consideration. However, it is needless to say that the thickness of the laminated films is preferably such that no cracking occurs in the following step e).

The step d) is schematically shown in FIG. 1 (3). An additional porous thin film 13 of gel is formed on the previously formed film 14, and, as shown in FIG. 1 (4), subsequent pre-annealing causes the additional porous thin film 13 of gel to be substantially united with the previously formed film 14 to form a substantially united film. In this case, the substantially united film refers to a film free from any interface attributable to the lamination, as well as a film which, unlike the final piezoelectric thin film, may have an interface of layers formed by lamination. When the steps a), b), and c) are further repeated, as shown in FIG. 1 (5), an additional porous thin film 13 of gel is formed, and, as shown in FIG. 1 (6), subsequent pre-annealing causes the additional film 13 of gel to be substantially united with the crystalline laminated film 14 to form a substantially united film.

Preferably, patterning and the formation of an electrode in the piezoelectric thin film are carried out in this stage.

Step e)

In this step, the laminated films of a crystalline metal oxide, thus obtained are further sintered to grow perovskite crystals. This step is often referred herein to as the "step of annealing."

According to a preferred embodiment of the present invention, the sintering temperature is preferably in the range of from 600 to 1200° C., more preferably in the range of from 800 to 1000° C. The sintering time may vary depending upon the sintering temperature and the type of the oven used. For example, when an annealing oven is used, the sintering time is preferably about 0.1 to 5 hr, more preferably about 0.5 to 2 hr. On the other hand, when RTA oven is used, the sintering time is preferably about 0.1 to 10 minutes, more preferably about 0.5 to 3 minutes.

Further, according to a preferred embodiment of the present invention, the annealing may be carried out in two stages. Preferably, the first stage is carried out at a temperature in the range of from 600 to 800° C., and the second stage is carried out at a temperature in the range of from 800 to 1000° C. According to a more preferred embodiment of the present invention, the first stage is carried out at a temperature in the range of from 600 to 750° C., and the second stage is carried out at a temperature in the range of from 800 to 950° C.

The above procedure can provide a piezoelectric thin film having no interface in its cross section.

According to a preferred embodiment of the present invention, in the step of annealing, the crystal grains are grown, enabling the formation of a piezoelectric thin film comprising a thin film with the average grain area of crystal grains observed on the surface thereof being not less than 0.1 $\mu m^2$, preferably in the range of from 0.5 to 50 $\mu m^2$.

FIG. 1 (7) shows an embodiment wherein an electrode 12 is provided on the thin film piezoelectric device 15, having no multilayer structure, formed by the above procedure.

Method According to Second Aspect of Invention

Steps a) and b)

The steps a) and b) in the method according to the second aspect of the invention are the same as those in the method according to the first aspect of the present invention.

Figure 2:
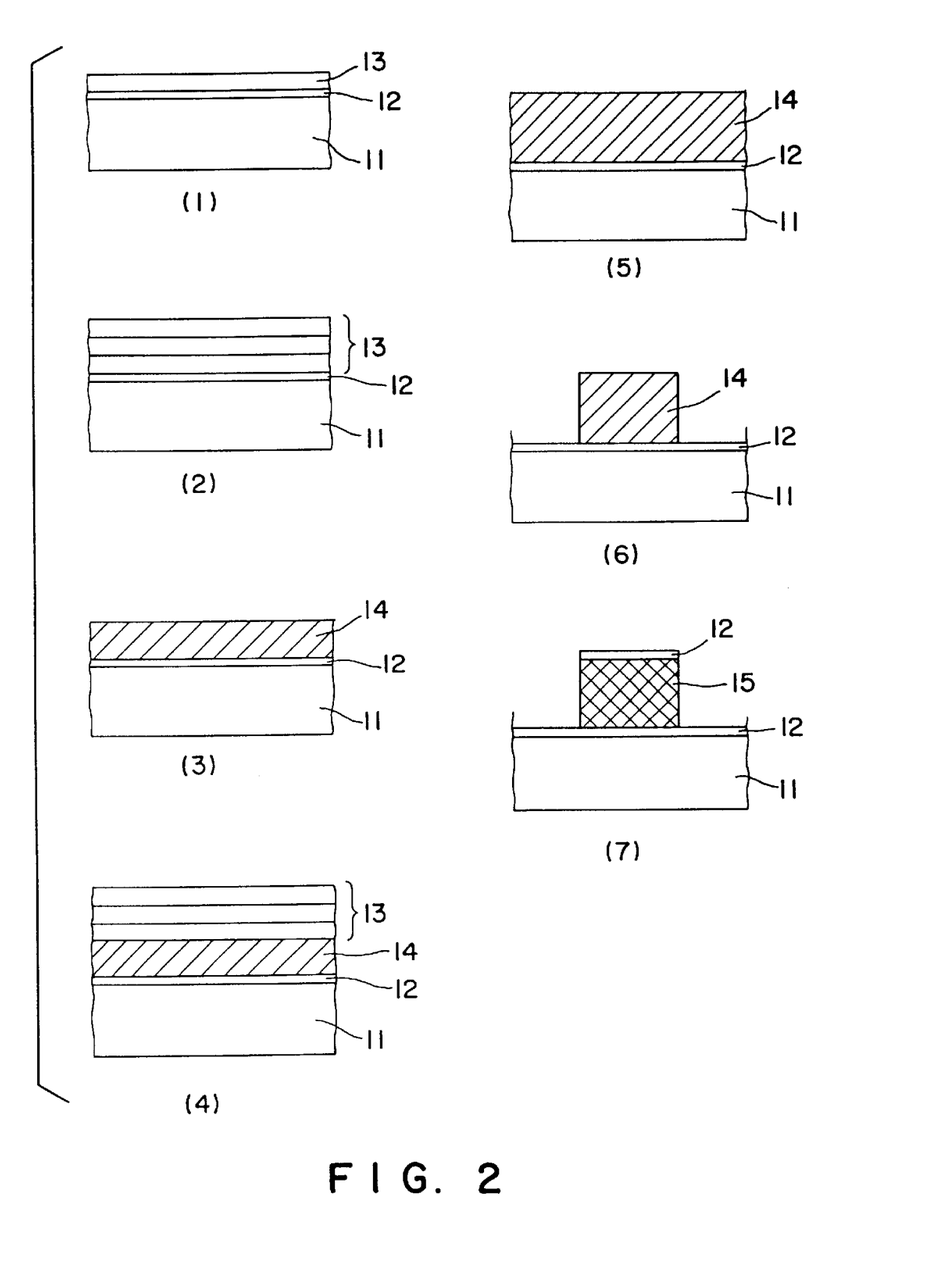
FIG. 2 is a diagram schematically showing the method for producing a thin film piezoelectric device according to a second aspect of the present invention.

These steps result in a substrate 11 with an electrode 12 and a porous thin film 13 of gel formed thereon, as shown in FIG. 2 (1).

Step f)

In the method according to the second aspect of the present invention, the steps a) and b) are repeated at least once to form a laminate of porous thin films of gel. In the repetition of the steps a) and b), the film thickness and the pre-sintering temperature may be the same as those described above for the formation of the first film on the substrate.

According to a preferred embodiment of the present invention, the thickness of the laminate of the thin films is preferably not more than 1 $\mu$m, still preferably not more than 0.5 $\mu$m. When the laminate of the thin films has the above thickness, the annealing in the subsequent step c') can be efficiently carried out without creating any crack.

This step results in the formation of a laminate of a plurality of porous thin films 13 of gel, as shown in FIG. 2 (2).

Step c')

In this step, the laminate of thin films formed in the step f) is sintered to convert the laminate to a film of a crystalline metal oxide. This step is similar to the step c) in the method according to the first aspect of the present invention. It is often referred herein to as the "step of pre-annealing."

The sintering may be carried out by heating the laminate of thin films of gel at a temperature high enough to convert the laminate to a film of a crystalline metal oxide. In this case, the laminate of the thin films need not be sintered to such an extent that the perovskite crystal occupies the major part of the crystals. The sintering may be terminated at the time when the laminate of the thin films has been uniformly crystallized. The sintering temperature and time may be substantially the same as those in the step c) in the method according to the first aspect of the present invention. Further, as with the step c) in the method according to the first aspect of the present invention, the step of pre-annealing may be carried out in two stages.

As shown in FIG. 2 (3), this step results in the conversion of a laminate of porous thin films 13 to a crystalline, thin film 14.

Step d')

In the method according to the second aspect of the present invention, the steps f) and c') are repeated at least once. Specifically, a series of procedures consisting of the step f), i.e., the step of repeating the steps a) and b) at least once to form a laminate of porous thin films of gel and the step c') of sintering the laminated of porous thin films of gel to convert the laminate to a film of a crystalline metal oxide are repeated at least once. Thus, laminated films of a crystalline metal oxide are formed.

Conditions for the repetition of the steps a) and b) and the step c') may be the same as those described above.

The thickness of the laminate in this step may be determined by taking the film thickness of the final piezoelectric thin film into consideration. However, it is needless to say that the thickness of the laminate is preferably such that no cracking occurs in the following step e').

In the step d'), as shown in FIG. 2 (4), an additional laminate 13 of porous thin films of gel is formed on the previously formed film 14, and, as shown in FIG. 2 (5), subsequent pre-annealing causes the additional laminate of porous thin film 13 of gel to be substantially united with the previously formed film 14 to form a substantially united film. The meaning of the substantially united film is the same as defined above.

Preferably, patterning and the formation of an upper electrode in the piezoelectric thin film are carried out in this stage. FIG. 2 (6) shows a film 14 patterned into a desired form.

Step e')

In this step, the laminate of a crystalline metal oxide thus obtained is further sintered to grow perovskite crystals. This step is similar to the step e) in the method according to the first aspect of the present invention. It is often referred herein to the "step of annealing."

The sintering temperature and time may be substantially the same as those in the step e) in the method according to the first aspect of the present invention. Further, as with the step e) in the method according to the first aspect of the present invention, the step of pre-annealing may be carried out in two stages.

FIG. 2 (7) shows an embodiment wherein an electrode 12 is provided on the thin film piezoelectric device 15, having no multilayer structure, formed by the above procedure.

Application of Piezoelectric Thin Film/Ink Jet Recording Head

The piezoelectric thin film according to the present invention may be used in various applications by taking advantage of good properties thereof.

For example, it can be used as a piezoelectric transducer of an ink jet recording head. The use of the thin film piezoelectric device according to the present invention is advantageous in that an ink can be ejected at a high pressure and the ink jet recording head can be driven at a high frequency.

Figure 3:
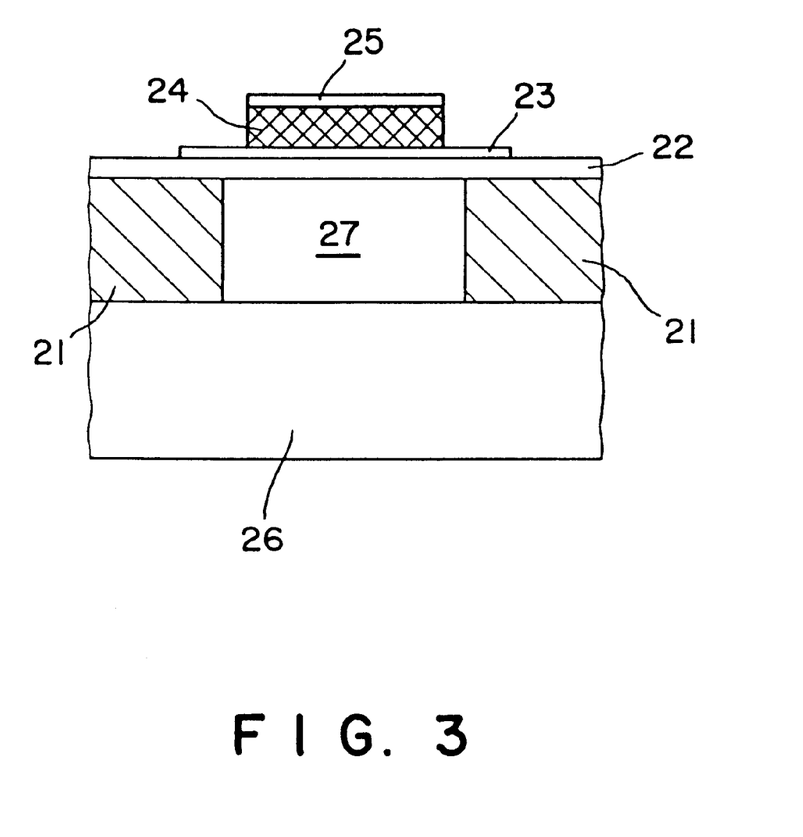
FIG. 3 is a schematic view of an ink jet recording head utilizing the piezoelectric thin film according to the present invention.

A preferred embodiment of the recording head utilizing the thin film piezoelectric device according to the present invention is shown in FIG. 3. This recording head comprises a single-crystal Si substrate 21 provided with an ink cavity 27 and joined to a second substrate 26. A diaphragm 22, a lower electrode 23, a piezoelectric film 24, and an upper electrode 25 are provided on the single-crystal Si substrate 21.

An ink is fed into the ink cavity 27 through an ink passage (not shown). In this case, a voltage is applied to the piezoelectric film 24 through the lower electrode 23 and the upper electrode 25. The application of the voltage results in deformation of the ink cavity 27, pressurizing the ink. The pressure ejects the ink through a nozzle (not shown), enabling ink jet recording.

The ink jet recording head can be prepared by any conventional method.

EXAMPLES

Example 1

(1) Lead acetate (0.1 mol) was dissolved in 20 ml of acetic acid, and the solution was then refluxed for 30 min. Thereafter, the solution was cooled to room temperature, and 0.052 mol of zirconium tetrabutoxide and 0.048 mol of titanium tetraisopropoxide were further dissolved in the solution. Water (1 mol) and a minor amount of diethylene glycol were then dropwise added to the solution, and the mixture was thoroughly stirred for hydrolysis. The reaction mixture was diluted with 2-ethoxyethanol, 5% by weight, based on the metal oxide, of hydroxypropyl cellulose was added thereto, and the mixture was thoroughly stirred to prepare a homogeneous sol.

A platinum electrode was formed on an aluminum substrate by sputtering, and the sol prepared above was spin-coated on the platinum electrode. The substrate coated with the sol was pre-sintered with a hot plate at 350° C. for 20 minutes. As a result, a 0.4 µm-thick amorphous porous thin film of gel could be formed without cracking.

Thereafter, the substrate with the thin film formed thereon was further heated in an annealing oven and held at 550° C. for one hr, thereby pre-annealing the thin film to form a 0.3 µm-thick, dense, thin film.

The thin film was examined by X-ray diffractometry. As a result, a diffraction pattern characteristic of a perovskite crystal was observed.

Further, the thin film was examined by reflection FT-IR (Fourier transform infrared absorption spectroscopy). As a result, no absorption peak, around 3400 $cm^{-1}$, attributable to a hydroxyl group was observed.

The sol prepared above was further spin-coated on the substrate with the thin film formed thereon, and the coating was pre-sintered at 350° C. to laminate a 0.4 µm-thick porous thin film of gel onto the previously formed thin film. The laminate was pre-annealed at 550° C. for one hr to form a crystalline, dense, thin film. The sol prepared above was further spin-coated on the thin film, and the coating was pre-sintered at 350° C. to laminate a 0.4 µm-thick porous thin film of gel onto the above thin film. The laminate was then pre-annealed at 550° C. for one hr, thereby forming a 0.9 µm-thick crystalline, dense, thin film.

(2) The substrate with the crystalline, dense, thin film formed thereon was heated to 700° C. under an oxygen stream in an annealing oven and held at that temperature for one hr, thereby conducting annealing. Thus, a 0.9 µm-thick piezoelectric thin film was prepared wherein the average grain area of crystal grains observed on the surface of the film under a metallographic microscope was 0.3 $µm^2$.

The piezoelectric thin film was examined by X-ray diffractometry. As a result, sharp and strong peaks attributable to a perovskite crystal were observed. In addition, the alumina substrate with the thin film formed thereon was cut, and the cross section of the thin film was observed under SEM (a scanning electron microscope). As a result, it was found that crystal grains were uniformly packed and no interface attributable to the lamination was present.

An aluminum electrode was formed on the piezoelectric thin film by vapor deposition to prepare a thin film piezoelectric device.

The properties of the thin film piezoelectric device were measured and found to be excellent. That is, the thin film piezoelectric device had a specific permittivity of 1200 and a piezoelectric strain constant of 70 pC/N.

A part of the piezoelectric thin film was dissolved in aqua regia, and the molar ratio of Pb to Zr to Ti in the piezoelectric thin film was determined by ICP (plasma atomic emission spectrometry) and found to be 1:0.52:0.48 which was the same as the molar ratio of Pb to Zr to Ti in the starting materials.

Example 2

(1) A mixture of 0.105 mol of lead acetate, 0.035 mol of zirconium acetyl acetate, 0.01 mol of magnesium acetate, and 30 ml of acetic acid was heated to 100° C. to prepare a solution. The solution was cooled to room temperature, and a solution of 0.035 mol of titanium tetraisopropoxide and 0.02 mol of pentaethoxyniobium dissolved in 50 ml of ethyl cellosolve was added thereto. Acetyl acetone (30 ml) was added to stabilize the system, 30% by weight, based on the metal oxide, of polyethylene glycol monomethyl ether was added, and ultrasonic energy was applied to prepare a homogeneous sol.

A platinum electrode was formed on a silicon substrate by sputtering, and the sol prepared above was spin-coated on the platinum electrode. The substrate coated with the sol was pre-sintered with a degreasing oven at 400° C. for 30 minutes. As a result, a 0.3 µm-thick amorphous porous thin film of gel could be formed without cracking.

Thereafter, a series of procedures consisting of the step of further coating the sol, prepared above, on the porous thin film of gel and the step of pre-sintering the coating at 400° C. hr were repeated twice to form a 0.9 µm-thick laminate of porous thin films of gel.

The laminate was heated to 650° C. over a period of 5 sec in an oxygen atmosphere using an RTA (rapid thermal annealing) oven and held at that temperature for one min, thereby carrying out pre-annealing. Thus, a 0.6 µm-thick dense, thin film was formed.

The thin film thus obtained was examined by X-ray diffractometry. As a result, a diffraction pattern characteristic of a pyrochlore crystal was observed. Further, it was examined by reflection FT-IR. As a result, no absorption peak, around 3400 $cm^{-1}$, attributable to a hydroxyl group was observed.

A series of procedures consisting of the step of further coating the sol, prepared above, on the thin film and the step of pre-sintering the coating at 400° C. were repeated thrice to form a 0.9 µm-thick laminate of amorphous, porous, thin films of gel.

Thereafter, pre-annealing was carried out in an RTA oven by holding the laminate at 650° C. for one min, thereby forming a 1.2 µm-thick, crystalline, dense, thin film.

(2) The substrate with the thin film formed thereon was patterned using a photoresist and etched with fluoroboric acid. The resist was peeled off, and annealing was carried out in an RTA oven by holding the substrate with the thin film formed thereon in an oxygen atmosphere at 900° C. for one min.

Thus, a 1.2 μm-thick piezoelectric thin film was prepared wherein the average grain area of crystal grains observed on the surface of the thin film was 1.5 μm².

The piezoelectric thin film was examined by X-ray diffractometry. As a result, sharp and strong peaks attributable to a perovskite crystal were observed. Further, the silicon substrate with the thin film formed thereon was cut, and the cross section of the thin film was observed under SEM. As a result, it was found that crystal grains were uniformly distributed and no interface attributable to the lamination was present.

An aluminum electrode was formed on the piezoelectric thin film by vapor deposition to prepare a thin film piezoelectric device. The properties of the thin film piezoelectric device were measured and found be to excellent. That is, the thin film piezoelectric device had a specific permittivity of 2000 and a piezoelectric strain constant of 150 pC/N.

(3) An ink jet recording head was prepared using the above piezoelectric thin film.

At the outset, a diaphragm of silicon nitride was formed on a silicon wafer by sputtering. A lower electrode of platinum and a piezoelectric thin film were then formed in the same manner as described above. The resultant piezoelectric thin film was photoetched to create patterns of 0.2 mm in width and 4 mm in length, and a groove having a width of 0.3 mm was formed within the silicon wafer by anisotropic etching. An upper electrode of gold was formed on the piezoelectric thin film, and the piezoelectric thin film was then joined to a second substrate of glass to form an ink passage. A head unit was taken off from the substrate and used as an ink jet recording head.

An ink could be ejected through the ink jet recording head with satisfactory ejecting force.

Examples 3 to 9

The procedure of Example 2 was repeated to form a 0.3 μm-thick, amorphous, porous, thin film of gel. A series of procedures consisting of the step of coating of the sol and pre-sintering the coating at 400° C. were further repeated twice to form a 0.9 μm-thick, porous, thin film of gel.

Thereafter, the thin film was rapidly heated to 650° C. under an oxygen atmosphere in an RTA oven and pre-annealed at that temperature for one min. Thus, a 0.6 μm-thick, crystalline, dense, thin film was prepared.

The above procedure was repeated ten times (i.e., total number of coatings of sol: 30) to prepare a 6 μm-thick piezoelectric thin film.

Annealing was then carried out by holding the substrate, with the thin film formed thereon, at temperatures specified in Table 1 under an oxygen atmosphere in an RTA oven for one min. As a result, for all the samples of Examples 3 to 9, no crack was observed, and no interface attributable to the lamination was observed in the cross section of the samples.

The surface of the piezoelectric thin films was observed under a metallographic microscope, and the state of crystals was examined by X-ray diffractometry. Further, an electrode was formed on each piezoelectric thin film to prepare piezoelectric devices which were then examined for piezoelectric properties. The results were as given in Table 1.

Table 1

| | Annealing temp. (° C.) | State of film surface and crystals | Piezoelectric strain constant (pC/N) |
|---|---|---|---|
| Ex. 3 | 600 | Small crystal grains studded in an island form | 10 |
| Ex. 4 | 700 | Average area of grains: 0.1 μm² | 50 |
| Ex. 5 | 800 | Average area of grains: 1.2 μm² | 100 |
| Ex. 6 | 900 | Average area of grains: 1.5 μm² | 150 |
| Ex. 7 | 1000 | Average area of grains: 2.0 μm² | 140 |
| Ex. 8 | 1100 | Crystal system having other composition included | 40 |
| Ex. 9 | 1200 | Crystal system having other composition increased | 20 |

For the thin films annealed at 800 to 1000° C., X-ray diffraction analysis showed sharp and strong peaks attributable to a perovskite crystal. On the other hand, for the thin film annealed at 700° C., the inclusion of a pyrochlore phase was observed, and the thin film annealed at 500° C. was substantially amorphous. The thin films annealed at 1100° C. or above showed a number of unidentifiable crystal peaks.

Examples 10 to 20

The procedure of Example 2 was repeated to form a 0.9 μm-thick, amorphous, porous, thin film of gel. Subsequently, pre-annealing was carried out with RTA oven at temperatures shown in Table 2 for three minutes to prepare 0.6 μm-thick, crystalline, dense, thin films. The above procedure was repeated 15 times (i.e., total number of coatings of sol: 30) to prepare 9 μm-thick piezoelectric thin films.

The thin films thus obtained were examined by reflection FT-IR. As a result, no hydroxyl group was detected for all the thin films. Further, no cracking was observed for all the thin films.

Annealing was then carried out for one min at temperatures specified in Table 2 under an oxygen atmosphere in an RTA oven, thereby growing crystal grains.

The average grain area of crystal grains observed on the surface of the thin films thus obtained was as given in Table 2. None of the thin films of Examples 10 to 20 suffered from cracking. Further, no interface was observed for the other thin films.

An electrode was formed on each thin film to prepare piezoelectric devices. The properties of these devices were as given in Table 2. When the pre-annealing temperature was in the range of from 500 to 700° C., the piezoelectric strain constant depended upon the final annealing temperature only.

TABLE 2

| | Pre-annealing (° C.) | Annealing (° C.) | Average grain area (μm²) | Piezoelectric strain constant (pC/N) |
|---|---|---|---|---|
| Ex. 10 | 500 | 800 | 1.2 | 100 |
| Ex. 11 | 500 | 900 | 1.5 | 150 |
| Ex. 12 | 500 | 1000 | 2.0 | 140 |

TABLE 2-continued

|  | Pre-annealing (° C.) | Annealing (° C.) | Average grain area ($\mu m^2$) | Piezoelectric strain constant (pC/N) |
| --- | --- | --- | --- | --- |
| Ex. 13 | 600 | 800 | 1.2 | 100 |
| Ex. 14 | 600 | 900 | 1.5 | 150 |
| Ex. 15 | 600 | 1000 | 2.0 | 140 |
| Ex. 16 | 700 | 800 | 1.2 | 100 |
| Ex. 17 | 700 | 900 | 1.5 | 150 |
| Ex. 18 | 700 | 1000 | 2.0 | 140 |
| Ex. 19 | 800 | 900 | 1.0 | 110 |
| Ex. 20 | 800 | 1000 | 1.0 | 90 |

Examples 21 to 25

Amorphous, porous, thin films of gel having thicknesses as shown in Table 3 were formed in the same manner as in Example 1, except that the diluting solvent and the coverage of the sol were varied. The thin films of gel were then pre-annealed at 550° C. for one hr, thereby preparing crystalline dense films. The above procedure was repeated the number of times as specified in Table 3 to laminate films, thereby preparing 2-$\mu$m thick thin films. The thin films were annealed at 750° C. for one hr under an oxygen stream in an annealing oven to prepare piezoelectric thin films.

For all the thin films, the average grain area of crystal grains observed on the surface of the thin film was 0.5 $\mu m^2$. The percentage cracking defined as the percentage of the number of thin film samples suffering from cracking in 20 thin film samples was as given in Table 3. Even for the thin films suffering from cracking problems, no interface attributable to the lamination was observed in the cross section of the thin films.

TABLE 3

|  | Thickness of porous thin film of gel ($\mu$m) | Number of times of lamination required for the preparation of piezoelectric device | Percentage cracking (%) |
| --- | --- | --- | --- |
| Ex. 21 | 0.01 | 300 | 0 |
| Ex. 22 | 0.1 | 30 | 0 |
| Ex. 23 | 0.3 | 10 | 0 |
| Ex. 24 | 0.6 | 5 | 5 |
| Ex. 25 | 1.0 | 3 | 70 |

An aluminum electrode was formed on the piezoelectric thin films by vapor deposition to prepare thin film piezoelectric devices which were then examined for properties. There was substantially no difference in properties between the thin films of Examples 21 to 25, and the specific permittivity and the piezoelectric strain constant were about 1400 and about 80 pC/N, respectively.

Examples 26 to 34

A diaphragm of silicon nitride and a lower electrode of platinum were formed on a silicon wafer in the same manner as in Example 2. A sol was prepared in the same manner as in Example 2. A series of procedures consisting of the step of coating the sol on the lower electrode of platinum and the step of pre-sintering the coating at 400° C. were repeated twice. Thus, a 0.7 $\mu$m-thick amorphous, porous, thin film of gel was prepared. The thin film was then pre-annealed in air at 550° C. for one hr, thereby preparing a 0.5 $\mu$m-thick, crystalline dense, thin film.

The above procedure were repeated to give thin films having thicknesses as shown in Table 4.

The thin films thus obtained were photoetched to create patterns of 0.2 mm in width and 4 mm in length. Regarding the patterning, good patterns having a substantially right-angled edge could be formed except for Examples 30 and 31 wherein the thin films were excessively etched to provide reverse tapered patterns (see FIG. 4).

Thereafter, annealing was carried out under an oxygen atmosphere in an RTA oven at temperatures specified in Table 4. A groove having a width of 0.3 mm was formed within the silicon wafer by anisotropic etching. An upper electrode of gold was then formed on the piezoelectric thin films, and the substrates with the piezoelectric thin films formed thereon were then joined to a second substrate of glass to form ink passages. Head units were taken off from the substrates and used as an ink jet recording head.

An ink was ejected through the ink jet recording heads. The results were as given in Table 4.

TABLE 4

|  | Film thickness ($\mu$m) | Etching properties | Annealing temp. (° C.) | Ink ejecting force |
| --- | --- | --- | --- | --- |
| Ex. 26 | 0.5 | Good | 900 | Satisfactory |
| Ex. 27 | 2 | Good | 900 | Excellent |
| Ex. 28 | 5 | Good | 900 | Excellent |
| Ex. 29 | 10 | Good | 900 | Excellent |
| Ex. 30 | 15 | Good* | 900 | Excellent |
| Ex. 31 | 20 | Good* | 900 | Satisfactory |
| Ex. 32 | 2 | Good | 600 | Good |
| Ex. 33 | 2 | Good | 800 | Excellent |
| Ex. 34 | 2 | Good | 1100 | Good |

*Over-etching which had no bad influence on a practical use was observed.

Comparative Example 1

The procedure of Example 1 was repeated to form an amorphous, porous, thin film of gel. The thin film was annealed under an oxygen stream in an annealing oven at 700° C. for one hr, thereby preparing a 0.3 $\mu$m-thick piezoelectric thin film. The above procedure was repeated thrice to prepare a 0.9 $\mu$m-thick piezoelectric thin film. No crack was created in the thin film. The observation of the thin film under a metallographic microscope has revealed that the average grain area of crystal grains observed on the surface of the thin film was as small as 0.1 $\mu m^2$ and the thin film had a specific permittivity of 800 and a piezoelectric strain constant of 40 pC/N. Further, the observation of the thin film under SEM have revealed the presence of an interface, attributable to the lamination, at intervals of 0.3 $\mu$m. Further, it was difficult to photoetch this thin film.

Comparative Example 2

The procedure of Example 2 was repeated to form an amorphous, porous, thin film of gel. Annealing was carried out by holding the thin film under an oxygen atmosphere in an RTA oven at 900° C. for one min to prepare a 0.2 $\mu$m-thick piezoelectric thin film. The above procedure was repeated six times to prepare a 1.2 $\mu$m-thick piezoelectric thin film. No crack was created in the thin film. The observation of the thin film under a metallographic microscope has revealed that the average grain area of crystal grains observed on the surface of the thin film was as small as 0.5 $\mu m^2$ and the thin film had a specific permittivity of 1200 and a piezoelectric strain constant of 60 pC/N. Further, the observation of the thin film under SEM have revealed the presence of an interface, attributable to the lamination, at intervals of 0.2 µm. Further, it was difficult to photoetch this thin film.

Further, regarding the composition of the thin film, the concentration of lead was lower than that in the sol. This appeared to be attributable to scattering of lead during the annealing. Furthermore, the concentration distribution of lead in the thickness direction of the thin film was observed.

Example 35

(1) The procedure of Example 1 (1) was repeated, except that pre-annealing was carried out at 450° C. for 30 min and further at 600° C. for 30 min instead of the pre-annealing at 550° C. for one hr in Example 1 (1).

Specifically, 0.1 mol of lead acetate was dissolved in 20 ml of acetic acid, and the solution was then refluxed for 30 min. Thereafter, the solution was cooled to room temperature, and 0.052 mol of zirconium tetrabutoxide and 0.048 mol of titanium tetraisopropoxide were further dissolved in the solution. Thereafter, 1 mol of water and a minor amount of diethylene glycol were dropwise added to the solution, and the mixture was thoroughly stirred for hydrolysis. The reaction mixture was diluted with 2-ethoxyethanol, 5% by weight, based on the metal oxide, of hydroxypropyl cellulose was added thereto, and the mixture was thoroughly stirred to prepare a homogeneous sol.

A platinum electrode was formed on an aluminum substrate by sputtering, and the sol prepared above was spin-coated on the platinum electrode. The substrate coated with the sol was pre-sintered at 350° C. As a result, a 0.4 µm-thick amorphous porous thin film of gel could be formed without cracking.

Thereafter, the substrate with the thin film formed thereon was further heated in an annealing oven and held at 450° C. for 30 min and further at 600° C. for 30 min, thereby pre-annealing the thin film to form a 0.3 µm-thick, dense, thin film.

The thin film was examined by X-ray diffractometry. As a result, a diffraction pattern characteristic of perovskite crystal was observed.

Further, the thin film was examined by reflection FT-IR. As a result, no absorption peak, around 3400 cm$^{-1}$, attributable to a hydroxyl group was observed.

The sol prepared above was further spin-coated on the substrate with the thin film formed thereon, and the coating was pre-sintered at 350° C. to laminate a 0.4 µm-thick porous thin film of gel onto the previously formed thin film. The laminate of porous thin films of gel was held at 450° C. for 30 min and further at 600° C. for 30 min to carry out pre-annealing, thereby forming a crystalline, dense, thin film. The sol prepared above was further spin-coated on the thin film, and the coating was pre-sintered at 350° C. to laminate a 0.4 µm-thick porous thin film of gel onto the above thin film. The laminated film was then held at 450° C. for 30 min and further at 600° C. for 30 min to carry out pre-annealing, thereby forming a 0.9 µm-thick crystalline, dense, thin film.

(2) The procedure of Example 1 (2) was repeated, except that the thin film prepared in the above step (1) was pre-annealed at 600° C. for 30 min and further at 800° C. for 30 min instead of the annealing at 700° C. for one hr.

Specifically, the substrate prepared above was held at 600° C. for 30 min and further at 800° C. for 30 min to carry out annealing. Thus, a 0.9 µm-thick piezoelectric thin film was prepared wherein the average grain area of crystal grains observed on the surface of the film under a metallographic microscope was 0.3 µm$^2$.

The piezoelectric thin film was examined by X-ray diffractometry. As a result, sharp and strong peaks attributable to a perovskite crystal was observed. Further, the alumina substrate with the thin film formed thereon was cut, and the cross section of the thin film was observed under SEM. As a result, it was found that crystal grains were uniformly packed and no interface attributable to the lamination was present.

An aluminum electrode was formed on the piezoelectric thin film by vapor deposition to prepare a thin film piezoelectric device.

The properties of the thin film piezoelectric device were measured and found be to excellent. That is, the thin film piezoelectric device had a specific permittivity of 1200 and a piezoelectric strain constant of 100 pC/N.

A part of the piezoelectric thin film was dissolved in aqua regia, and the molar ratio of Pb to Zr to Ti in the piezoelectric thin film was determined by ICP and found to be 1:0.52:0.48 which was the same as the molar ratio of Pb to Zr to Ti in the starting materials.

Example 36

(1) The procedure of Example 2 (1) was repeated, except that pre-annealing was carried out at 600° C. for 5 min and further at 725° C. for one min instead of the pre-annealing at 650° C. for one hr in Example 2 (1).

Specifically, a mixture of 0.105 mol of lead acetate, 0.035 mol of zirconium acetyl acetate, 0.01 mol of magnesium acetate, and 30 ml of acetic acid was heated to 100° C. to prepare a solution. The solution was cooled to room temperature, and a solution of 0.035 mol of titanium tetraisopropoxide and 0.02 mol of pentaethoxyniobium dissolved in 50 ml of ethyl cellosolve was added thereto. Acetyl acetone (30 ml) was added to stabilize the system, 30% by weight, based on the metal oxide, of polyethylene glycol monomethyl ether was added, and ultrasonic energy was applied to prepare a homogeneous sol.

A platinum electrode was formed on a silicon substrate by sputtering, and the sol prepared above was spin-coated on the platinum electrode. The substrate coated with the sol was pre-sintered with a degreasing oven at 400° C. As a result, a 0.3 µm-thick amorphous porous thin film of gel could be formed without cracking.

Thereafter, a series of procedures consisting of the step of further coating the sol, prepared above, on the porous thin film of gel and the step of pre-sintering the coating at 400° C. were repeated twice to form a 0.9 µm-thick laminate of porous thin films of gel.

The laminate was heated to 600° C. over a period of 5 sec in an oxygen atmosphere using an RTA oven, held at that temperature for 5 min, heated to 725° C., and held at that temperature for one min, thereby carrying out pre-aneeling. Thus, a 0.6 µm-thick dense, thin film was formed.

The thin film thus obtained was examined by X-ray diffractometry. As a result, diffraction patterns characteristic of pyrochlore crystal and perovskite crystal were observed. Further, it was examined by reflection FT-IR. As a result, no absorption peak, around 3400 cm$^{-1}$, attributable to a hydroxyl group was observed.

A series of procedures consisting of the step of further coating the sol, prepared above, on the porous thin film of gel and the step of pre-sintering the coating at 400° C. were repeated thrice to form a 0.9 μm-thick laminate of amorphous, porous, thin films of gel.

Thereafter, the laminate was heated to 600° C. over a period of 5 sec in an RTA oven, held at that temperature for 5 min, heated to 725° C., and held at that temperature for one min, thereby carrying out pre-annealing to form a 1.2 μm-thick, crystalline, dense, thin film.

(2) The procedure of Example 2 (2) was repeated, except that the thin film prepared in the above step (1) was annealed at 650° C. for 5 min and further at 900° C. for one min instead of the annealing at 900° C. for one min.

Specifically, the substrate with the thin film formed thereon was patterned using a photoresist and etched with fluoroboric acid. The resist was peeled off, and annealing was carried out in an RTA oven by holding the substrate with the thin film formed thereon in an oxygen atmosphere at 650° C. for 5 min and further at 900° C. for one min.

Thus, a 1.2 μm-thick piezoelectric thin film was prepared wherein the average grain area of crystal grains observed on the surface of the film was 1.5 μm$^2$.

The piezoelectric thin film was examined by X-ray diffractometry. As a result, sharp and strong peaks attributable to a perovskite crystal were observed. Further, the silicon substrate with the thin film formed thereon was cut, and the cross section of the thin film was observed under SEM. As a result, it was found that crystal grains were uniformly distributed and no interface attributable to the lamination was present.

An aluminum electrode was formed on the piezoelectric thin film by vapor deposition to prepare a thin film piezoelectric device. The properties of the thin film piezoelectric device were measured and found be to excellent. That is, the thin film piezoelectric device had a specific permittivity of 2000 and a piezoelectric strain constant of 150 pC/N.

(3) An ink jet recording head was prepared using the above piezoelectric thin film in the same manner as in Example 2 (3). An ink could be ejected through the ink jet recording head with satisfactory ejecting force.

What is claimed is:

1. A method for preparing a piezoelectric thin film by a sol-gel process, comprising the steps of:
   a) coating a substrate with a sol composition comprising a sol, of a metal component, and a polymer compound and then drying the coating to form a film;
   b) pre-sintering the film to form a porous thin film of gel comprising an amorphous metal oxide;
   f) repeating the steps a) and b) at least once to form laminated layers of porous thin films comprising the amorphous metal oxide;
   c') pre-annealing the laminated layers of the porous thin films to convert the laminated layers to a crystalline metal oxide;
   d') repeating the steps f) and c') at least once to form laminated films of the crystalline metal oxide; and
   e') annealing the films prepared in the step d') to grow crystal grains of perovskite type in the laminated films into a larger size, wherein this annealing step is carried out in two stages, a first stage of which is carried out at a temperature in a range of from 600 to 800° C. with a second stage being carried out at a temperature in a range of from 800 to 1000° C.

2. The method for preparing the piezoelectric thin film according to claim 1, wherein the pre-annealing in the step c') is carried out at a temperature in a range of from 400 to 800° C.

3. The method for preparing the piezoelectric thin film according to claim 1, wherein the pre-annealing in the step c') is carried out in two stages, a first stage of which is carried out at a temperature in a range of from 400 to 600° C. with a second stage being carried out at a temperature in a range of from 600 to 800° C.

4. The method for preparing the piezoelectric thin film according to claim 1, wherein the thickness of the porous thin film formed in the step b) or the thickness of the laminated layers of porous thin films formed in the step f) is 0.01 to 1 μm.

5. The method for preparing the piezoelectric thin film according to claim 1, wherein the laminated films of the crystalline metal oxide prepared in the step d') is patterned into a thin film piezoelectric device form prior to the step e').

6. A method for preparing a piezoelectric thin film by a sol-gel process, comprising the steps of:
   a) coating a substrate with a sol composition comprising a sol, of a metal component, and a polymer compound and then drying the coating to form a film;
   b) pre-sintering the film to for a porous thin film of gel comprising an amorphous metal oxide;
   c ) pre-annealing the porous thin film of gel to bring the porous thin film to a film formed of a crystalline metal oxide,
   d) repeating the steps a), b), and c) at least once to form laminated films of the crystalline metal oxide; and
   e) annealing the laminated films prepared in the step d) to grow crystal grains of perovskite type in the film of the crystalline metal oxide into a larger size, wherein this annealing step is carried out in two stages, a first stage of which is carried out at a temperature in a range from 600 to 800° C. with a second stage being carried out at a temperature in a range from 800 to 1000° C.

7. The method for preparing the piezoelectric thin film according to claim 6, wherein the pre-annealing in the step c) is carried out at a temperature in a range of from 400 to 800° C.

8. The method for preparing the piezoelectric thin film according to claim 6, wherein the pre-annealing in the step c) is carried out in two stages, a first stage of which is carried out at a temperature in a range of from 400 to 600° C. with a second stage being carried out at a temperature in a range of from 600 to 800° C.

9. The method for preparing the piezoelectric thin film according to claim 6, wherein a thickness of the porous thin film formed in the step b) or a thickness of the laminated films formed in the step d) is 0.01 to 1 μm.

10. The method for preparing the piezoelectric thin film according to claim 6, wherein the laminated films of the crystalline metal oxide prepared in the step d) are patterned into a thin film piezoelectric device form prior to the step e).

* * * * *